United States Patent
Yamaya

(10) Patent No.: US 10,788,738 B2
(45) Date of Patent: Sep. 29, 2020

(54) HEAD-UP DISPLAY DEVICE

(71) Applicant: NIPPON SEIKI CO., LTD., Niigata (JP)

(72) Inventor: Shuichi Yamaya, Niigata (JP)

(73) Assignee: NIPPON SEIKI CO., LTD., Niigata (JP)

( * ) Notice: Subject to any disclaimer, the term of this patent is extended or adjusted under 35 U.S.C. 154(b) by 0 days.

(21) Appl. No.: 16/484,709

(22) PCT Filed: Feb. 6, 2018

(86) PCT No.: PCT/JP2018/004045
§ 371 (c)(1),
(2) Date: Aug. 8, 2019

(87) PCT Pub. No.: WO2018/150957
PCT Pub. Date: Aug. 23, 2018

(65) Prior Publication Data
US 2020/0004119 A1    Jan. 2, 2020

(30) Foreign Application Priority Data
Feb. 17, 2017    (JP) .................................. 2017-027449

(51) Int. Cl.
*G02B 27/01*      (2006.01)
*G03B 21/16*      (2006.01)
(Continued)

(52) U.S. Cl.
CPC ......... *G03B 21/16* (2013.01); *G03B 21/2013* (2013.01); *G03B 21/2066* (2013.01);
(Continued)

(58) Field of Classification Search
CPC ..... F21V 29/75; G02B 27/0101; G02B 27/01; G03B 3/16; G03B 3/2013
See application file for complete search history.

(56) References Cited

U.S. PATENT DOCUMENTS

2009/0161354 A1*   6/2009   Hsu ........................... F21K 9/00
                                                                                  362/227
2014/0152711 A1*   6/2014   Sekiya ................. G03B 21/006
                                                                                  345/690

(Continued)

FOREIGN PATENT DOCUMENTS

JP      2011-171535 A    9/2011
JP      2014-085657 A    5/2014
(Continued)

OTHER PUBLICATIONS

International Search Report issued in corresponding International Patent Application No. PCT/JP2018/004045, dated Apr. 10, 2018, with English Translation.

*Primary Examiner* — Julie A Bannan
(74) *Attorney, Agent, or Firm* — McDermott Will & Emery LLP

(57) ABSTRACT

A head-up display device is provided with: a combined light output unit which outputs combined light obtained by combining light emitted by a plurality of light sources which emit light having different wavelengths; and a heat dissipator which dissipates heat emitted by the light sources. The head-up display device displays a virtual image by means of the combined light. The plurality of light sources include a first light source which operates in a first operation guaranteed temperature band, and second light sources which operate in a second operation guaranteed temperature band having an upper limit higher than that of the first operation guaranteed temperature band. The first light source is provided in a location on the heat dissipator having a higher heat dissipation characteristic than the locations of the second light sources.

2 Claims, 3 Drawing Sheets

(51) Int. Cl.
  *G03B 21/20* (2006.01)
  *H05K 7/20* (2006.01)
  *B60K 35/00* (2006.01)

(52) U.S. Cl.
  CPC ............ *H05K 7/2039* (2013.01); *B60K 35/00* (2013.01); *B60K 2370/1529* (2019.05); *B60K 2370/167* (2019.05); *G02B 27/01* (2013.01)

(56) References Cited

U.S. PATENT DOCUMENTS

| | | | |
|---|---|---|---|
| 2014/0355241 A1* | 12/2014 | Takenaka | F21V 23/006 362/84 |
| 2015/0092118 A1* | 4/2015 | Hada | G02B 26/0833 349/11 |
| 2015/0260984 A1* | 9/2015 | Yamakawa | H04N 9/3129 345/591 |
| 2016/0258611 A1 | 9/2016 | Takahashi et al. | |
| 2017/0201068 A1* | 7/2017 | Furuya | H01S 5/4093 |
| 2017/0317257 A1 | 11/2017 | Ezaki et al. | |

FOREIGN PATENT DOCUMENTS

| | | |
|---|---|---|
| JP | 2016-051802 A | 4/2016 |
| JP | 2016-164922 A | 9/2016 |
| WO | 2016/063540 A1 | 4/2016 |

\* cited by examiner

HEAD-UP DISPLAY DEVICE

CROSS REFERENCE

This application is the U.S. National Phase under 35 U.S.C. § 371 of international Application No. PCT/JP2018/004045, filed on Feb. 6, 2018, which claims the benefit of Japanese Application No. 2017-027449, filed on Feb. 17, 2017, the entire contents of each are hereby incorporated by reference.

TECHNICAL FIELD

The present invention relates to a head-up display device having a heat dissipator which dissipates heat generated by a light source.

BACKGROUND ART

A conventional head-up display device is disclosed in Patent Document 1. In this head-up display device, a virtual image is displayed by combining light emitted by a plurality of light sources which emit light having different wavelengths. The plurality of light sources are provided on the surface of a common circuit board, and a heat dissipator makes contact with the rear surface of the circuit board to dissipate heat generated by the light sources.

PRIOR ART DOCUMENT

Patent Document

Patent Document 1: Japanese Unexamined Patent Application Publication No. 2014-85657

SUMMARY OF THE INVENTION

Problems to be Solved by the Invention

However, when the operation guaranteed temperatures for the plurality of light sources which emit light having different wavelengths are different from each other, heat generated by the light sources is mutually exchanged via the circuit board and the heat dissipator, and therefore, it is necessary to adjust the operation to that of the light source having a low operation guaranteed temperature, and the performance of each light source cannot be fully utilized.

The present invention has been made in view of the problems described above, and an object of the present invention is to efficiently dissipate heat generated by a plurality of light sources which emit light having different wavelengths, in a head-up display device having the light sources.

Solution to Problem

A head-up display device according to the present invention includes:
  a combined light output unit which outputs combined light obtained by combining light emitted by a plurality of light sources which emit light having different wavelengths; and
  a heat dissipator which dissipates heat generated by the light sources,
  the head-up display device displaying a virtual image by means of the combined light, and being configured such that:
    the plurality of light sources include a first light source which operates in a first operation guaranteed temperature band, and a second light source which operates in a second operation guaranteed temperature band having an upper limit higher than that of the first operation guaranteed temperature band, and
    the first light source is provided in a location on the heat dissipator having a higher heat dissipation characteristic than the location of the second light source.

The head-up display device according to the present invention is preferably configured such that:
    the heat dissipator is injection molded from a high thermal conductivity resin, and
    a weld line is formed between the locations in which the first light source and the second light source are arranged.

Effect of the Invention

According to the present invention, it is possible to efficiently dissipate heat generated by a plurality of light sources which emit light having different wavelengths.

MODE FOR CARRYING OUT THE INVENTION

An embodiment of the present invention is described below with reference to the accompanying drawings.

Figure 1:
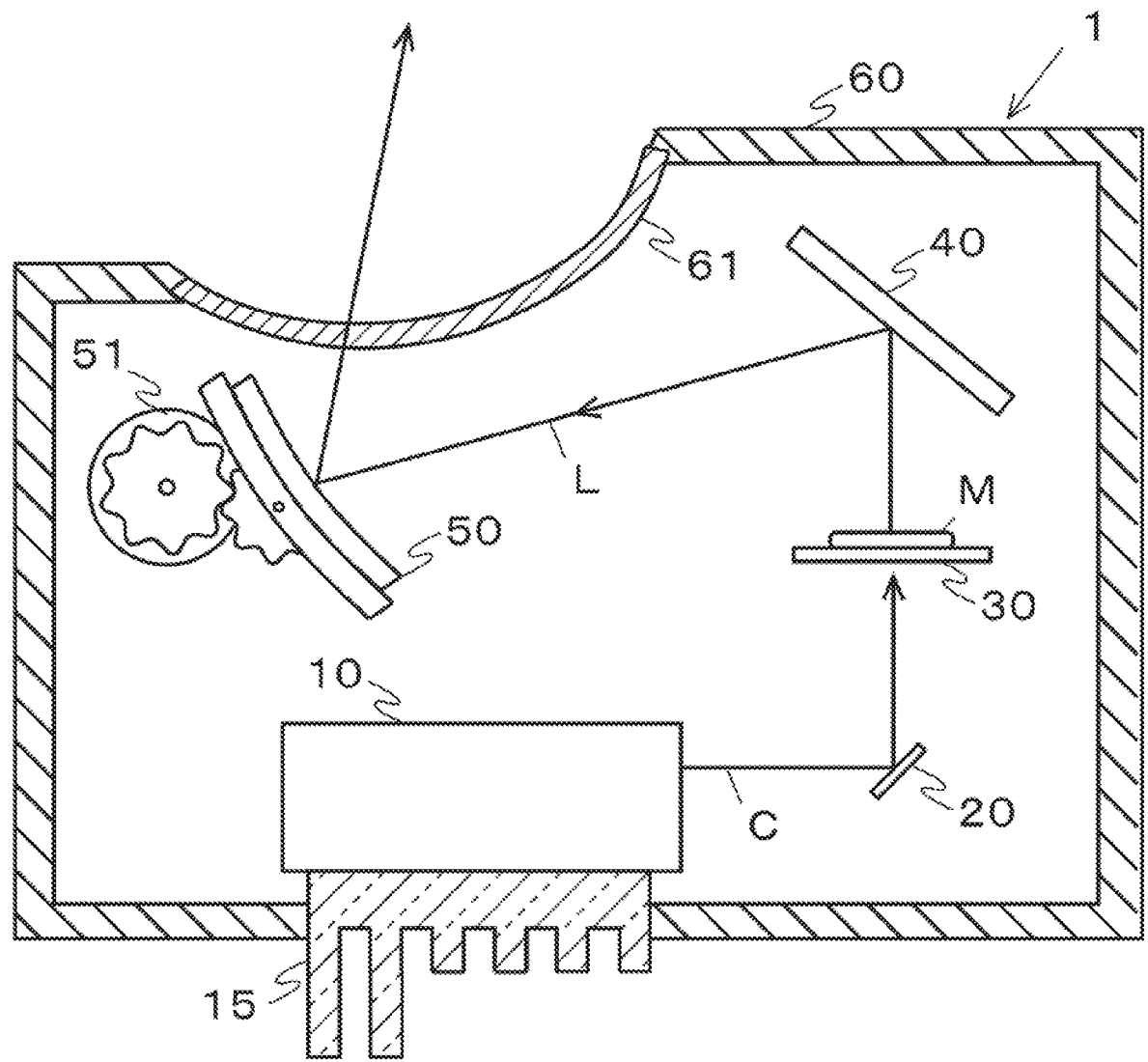
FIG. 1 is a diagram showing a configuration of a head-up display device according to an embodiment of the present invention.
Figure 2:
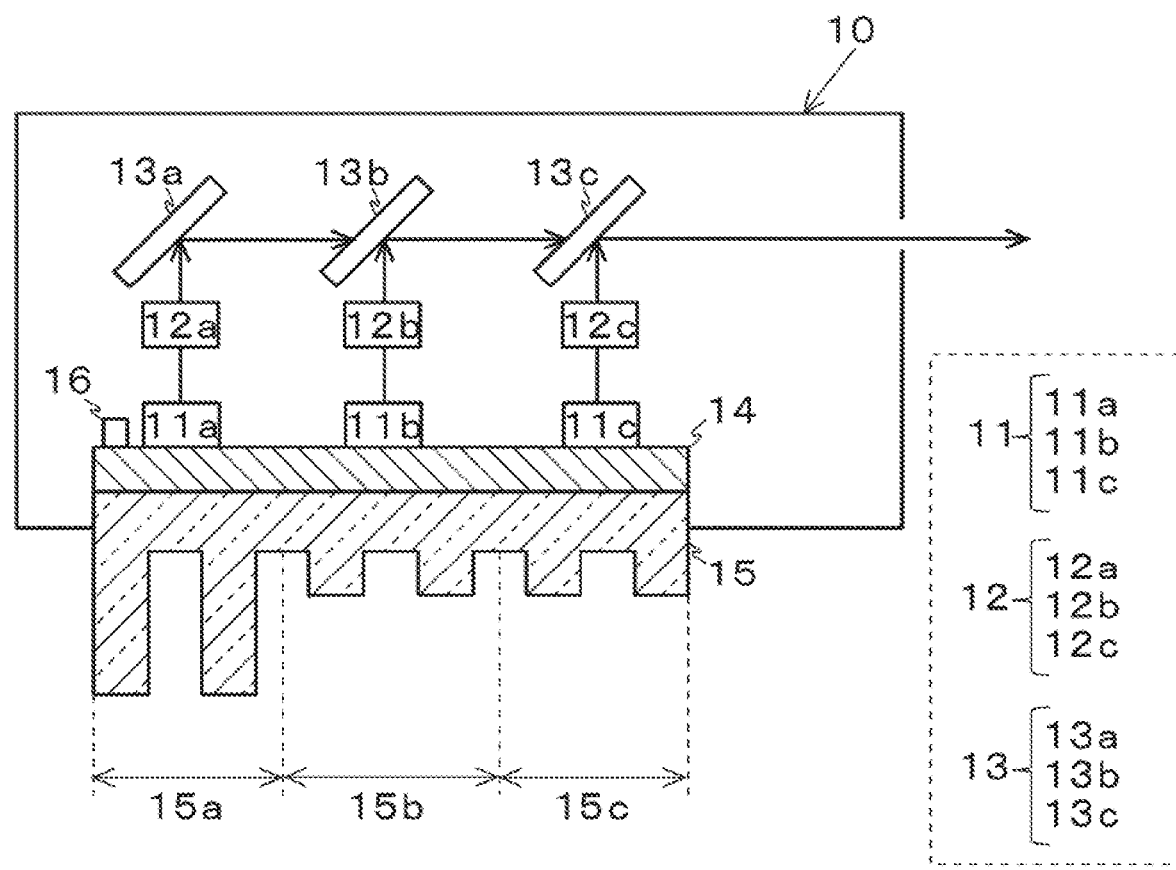
FIG. 2 is a diagram showing a configuration of a combined light output unit of the head-up display device.
Figure 3:
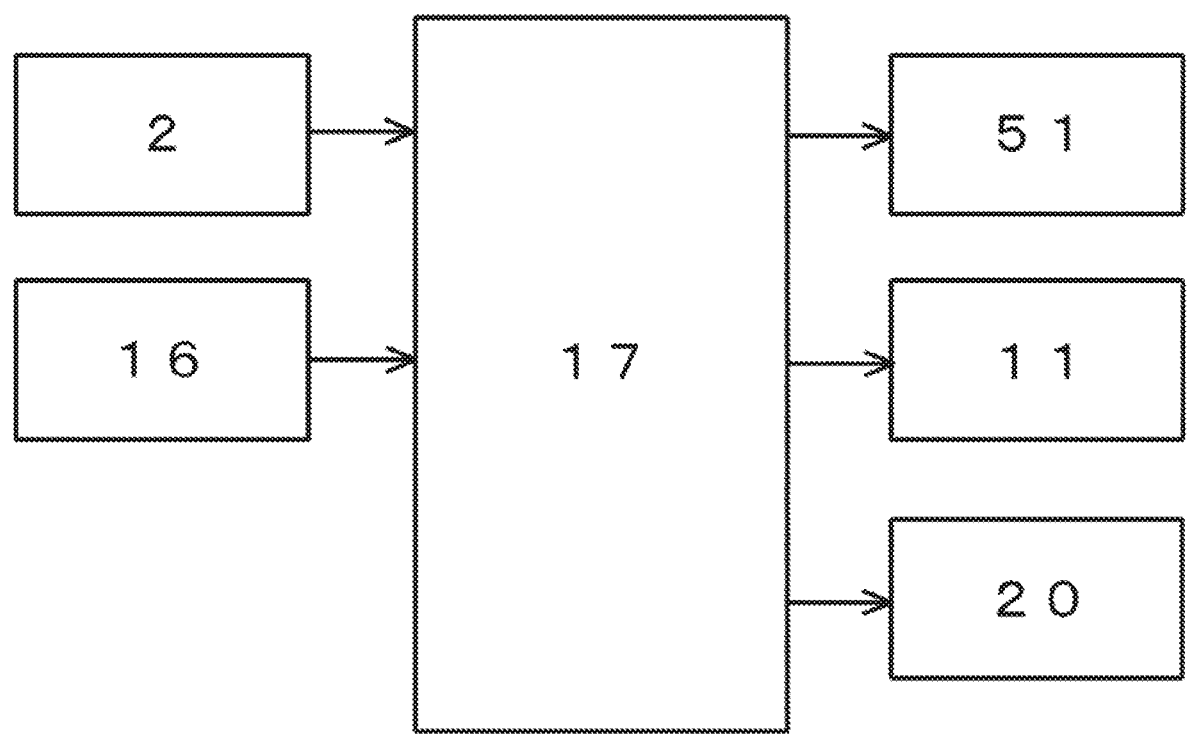
FIG. 3 is a diagram showing an electrical configuration of the head-up display device.

As shown in FIG. 1, a head-up display device 1 according to the present invention includes a combined light output unit 10, a scanning unit 20, a transparent screen 30, a flat mirror 40, a concave mirror 50, a mirror drive unit 51, a casing 60, and a light transmitting portion 61.

The combined light output unit 10 includes a light source 11, a light focusing optical unit 12, a multiplexing unit 13, a circuit board 14, a heat dissipator 15, a temperature detection unit 16, and a control unit 17. The combined light output unit 10 outputs, to the scanning unit 20, combined light C obtained by combining light emitted by the light source 11.

The scanning unit 20 is a MEMS mirror that vibrates so as to two-dimensionally scan in the horizontal direction and the vertical direction based on a drive signal from the control unit 17. The scanning unit 20 reflects the combined light C toward a rear surface of the transparent screen 30.

The transparent screen 30 is a screen constituted by a holographic diffuser, a microlens array, or a polarizing plate. The transparent screen 30 receives, from the rear surface, the combined light C reflected by the scanning unit 20, and transmits and disperses the light to display a display image M on a front surface side.

The flat mirror 40 is a mirror that reflects, toward the concave mirror 50, display light L of the display image M displayed on the front surface of the transparent screen 30. As a result of causing the light of the display light L to go around, a long optical path length can be secured such that the virtual image is more distantly displayed.

The concave mirror 50 is a mirror that reflects the display light L reflected from the flat mirror 40 toward a windshield of a vehicle via the light transmitting portion 61. The display light L emitted toward the windshield is displayed in front of the windshield as a virtual image. The display image M is enlarged by the concave mirror 50 such that the virtual image is displayed larger.

The mirror drive unit 51 is a drive unit that rotates the concave mirror 50 by means of rotation of an electric motor such as a stepping motor. The mirror drive unit 51 rotates the concave mirror 50 to a predetermined angle based on a drive signal from the control unit 17. The position, on the windshield of the vehicle, to be irradiated with the display light L can be altered by rotating the concave mirror 50 by means of the mirror drive unit 51, which enables the display position of the virtual image to be adjusted to match the height of the line-of-sight (eye point) of a passenger in the vehicle.

The light transmitting portion 61 is a plate made of a light transmitting resin such as an acrylic resin, and is fitted so as to cover an opening (emission opening) formed in the casing 60, which is made of a non-transmissive synthetic resin.

The light source 11 is a semiconductor light source. The light source 11 includes an amber light source 11a which emits amber light, a blue light source 11b which emits blue light, and a green light source 11c which emits green light.

The amber light source 11a operates in an operation guaranteed temperature band (first operation guaranteed temperature band) of −40 to 100° C., and emits light having a wavelength of 617 nm. The amber light source 11a is a group III-V semiconductor light source which uses Al (aluminum), Ga (gallium), or In (indium) as a group III element, and P (phosphorus) a group V element.

The blue light source 11b operates in an operation guaranteed temperature band (second operation guaranteed band) of −40 to 125° C., and emits light having a wavelength of 459 nm. The blue light source 11b is a GaN (gallium nitride) semiconductor light source having a thin-film structure.

The green light source 11c operates in the second operation guaranteed band, and emits light having a wavelength of 500 to 600 nm. The green light source 11c is a GaN (gallium nitride) semiconductor light source having a thin-film structure.

The light focusing optical unit 12 reduces the spot diameter of light emitted from the light sources by using a lens or the like to yield convergent light. The light focusing optical unit 12 includes a first converging optical unit 12a which converges light from the amber light source 11a, a second converging optical unit 12b which converges light from the blue light source 11b, and a third converging optical unit 12c which converges light from the green light source 11c.

The multiplexing unit 13 is a dichroic mirror that reflects light within a specific wavelength band and transmits light having other wavelengths. The multiplexing unit 13 includes a first multiplexing unit 13a that reflects light from the amber light source 11a, a second multiplexing unit 13b that transmits light emitted by the amber light source 11a and reflects light from the blue light source 11b, and a third multiplexing unit 13c that transmits light from the amber light source 11a and the blue light source 11b and reflects light emitted by the green light source.

The circuit board 14 is a rigid board constituted by an alumina board having a surface on which the light source 11 is mounted. A back surface of the circuit board 14, on which the light source 11 is not mounted, makes contact with the heat dissipator 15 via a thermally conductive sheet, and heat generated by the light source 11 is dissipated to the heat dissipator 15 via the circuit board 14 and the thermally conductive sheet.

The heat dissipator 15 is formed by injection molding of a resin (high thermal conductivity resin) which has a thermally conductive filler such as a ceramic filler added thereto. The high thermal conductivity resin has a thermal conductivity of at least 1.0 [W/mK: watts per meter per kelvin], which is higher than the thermal conductivity of common resins such as polypropylene or ABS resin.

The heat dissipator 15 includes a weld line where the injected resin merges, between a location 15a corresponding to the amber light source 11a, and a location 15b corresponding to the blue light source 11b and a location 15c corresponding to the green light source 11c. The weld line reduces the likelihood of heat exchange between the locations 15a, 15b and 15c, and therefore, transfer of heat generated by the light sources 11a, 11b and 11c to the other light sources via the heat dissipator 15 is suppressed.

Furthermore, the volume of the location 15a corresponding to the amber light source 11a, which operates in the first operation guaranteed temperature band, is larger than that of the locations 11b and 11c corresponding to the blue light source 11b and the green light source 11c, which operate in the second operation guaranteed temperature band, and the amber light source 11a is provided in a location having a higher heat dissipation characteristic than the locations of the other light sources 11b and 11c.

The temperature detection unit 16 is a temperature sensor such as a thermistor that detects temperature. The temperature detection unit 16 detects the temperature in the vicinity of the light source 11 and outputs the temperature to the control unit 17. Based on the input temperature, the control unit 17 dims or turns off the light source 11 when the temperature of the light source 11 becomes a predetermined temperature or higher, such that the light source 11 does not become damaged.

The control unit 17 is constituted by a microcontroller, an FPGA (Field-Programmable Gate Array), an ASIC (Application Specific Integrated Circuit), or the like. The control unit 17 acquires various vehicle information such as the travel speed of the vehicle from a communication path 2 that conforms to a communication protocol, such as a CAN (Controller Area Network). The control unit 17 displays the various vehicle information that is acquired as the display image M.

As described above, the head-up display device 1 according to the present invention includes: a combined light output unit 10 which outputs combined light C obtained by combining light emitted by a plurality of light sources 11 which emit light having different wavelengths; and a heat dissipator 15 which dissipates heat emitted by the light sources 11, the head-up display device 1 displaying a virtual image by means of the combined light C, wherein the plurality of light sources 11 include a first light source 11a which operates in a first operation guaranteed temperature band, and second light sources 11b and 11c which operate in a second operation guaranteed temperature band having an upper limit higher than that of the first operation guaranteed temperature band, and the first light source 11a is provided in a location 15a on the heat dissipator 15 having a higher heat dissipation characteristic than the locations of the second light sources 11b and 11c.

With such a configuration, it is possible to efficiently dissipate heat generated by a plurality of light sources which emit light having different wavelengths.

Furthermore, the heat dissipator 15 of the head-up display device 1 according to the present invention is injection molded from a high thermal conductivity resin, and a weld line is formed between the location in which the first light source 11a is arranged and the locations in which the second light sources 11b and 11c are arranged (between 15a and 15b).

With such a configuration, transfer of heat generated by the second light source 11b, which operates in the second operation guaranteed temperature band, to the first light source 11a, which operates in the first operation guaranteed temperature band, can be suppressed, and heat generated by the plurality of light sources which emit light having different wavelengths can be efficiently dissipated.

The head-up display device 1 according to the present invention has been described above. The present invention is in no way limited to the embodiment described above (including the contents of the drawings), and modifications (including the omission of constituent elements) may be made to the embodiment described above within the scope of the present invention.

INDUSTRIAL APPLICABILITY

The present invention is suitable for a head-up display device mounted on a vehicle.

DESCRIPTION OF REFERENCE NUMERALS

1 Head-up display device
2 Communication path
10 Combined light output unit
11 Light source
11a Amber light source (first light source)
11b Blue light source (second light source)
11c Green light source (second light source)
12 Light focusing optical unit
13 Multiplexing unit
14 Circuit board
15 Heat dissipator
16 Temperature detection unit
17 Control unit
20 Scanning unit
30 Transparent screen
40 Flat mirror
50 Concave mirror
51 Concave mirror drive unit
60 Casing
61 Light transmitting portion

The invention claimed is:

1. A head-up display device comprising:
a first light source that 1) emits light having a first wavelength and 2) operates in a first operation guaranteed temperature band;
a second light source that 1) emits light having a second wavelength different from the first wavelength and 2) operates in a second operation guaranteed temperature band having an upper limit higher than that of the first operation guaranteed temperature band;
a combined light output unit that outputs combined light obtained by combining light emitted by the first light source and the second light source; and
a heat dissipator that dissipates heat generated by the first and second light sources,
the head-up display device displaying a virtual image by means of the combined light, wherein
the heat dissipator includes a first part on which the first light source is provided and a second part on which the second light source is provided,
the second part of the heat dissipator is disposed directly adjoining the first part of the heat dissipator,
the heat dissipator includes a weld line between the first part and the second part of the heat dissipator, and
the first part of the heat dissipator has a higher heat dissipation characteristic than the second part of the heat dissipator.

2. The head-up display device according to claim 1, wherein
the heat dissipator is injection molded from a high thermal conductivity resin so that the weld line is formed between the first part of the hear dissipator on which the first light source is provided and the second part of the hear dissipator on which the second light source is provided.

* * * * *